United States Patent [19]

Gatos et al.

[11] 4,320,247
[45] Mar. 16, 1982

[54] SOLAR CELL HAVING MULTIPLE P-N JUNCTIONS AND PROCESS FOR PRODUCING SAME

[75] Inventors: Harry C. Gatos, Weston; Jim-Yong Chi, Bedford, both of Mass.

[73] Assignee: Massachusetts Institute of Technology, Cambridge, Mass.

[21] Appl. No.: 175,728

[22] Filed: Aug. 6, 1980

[51] Int. Cl.³ .................... H01L 31/06; H01L 31/18
[52] U.S. Cl. .................................. 136/255; 29/572; 148/1.5; 148/176; 357/30; 136/261
[58] Field of Search .................. 136/255; 357/30; 29/572; 148/1.5, 176

[56] References Cited

U.S. PATENT DOCUMENTS

| | | | |
|---|---|---|---|
| 3,690,953 | 9/1972 | Wise | 136/255 |
| 3,969,746 | 7/1976 | Kendall et al. | 136/255 |
| 4,116,717 | 9/1978 | Rahilly | 136/255 |
| 4,136,435 | 1/1979 | Li | 29/572 |
| 4,153,476 | 5/1979 | Shezpuk | 136/246 |

OTHER PUBLICATIONS

W. Kaiser et al., "Mechanism of the Formation of Donor States In Heat-Treated Silicon," *Phys. Rev.*, vol. 112, pp. 1546-1554 (1958).
D. Helmreich et al., "Oxygen In Silicon: A Modern View," Semiconductor Silicon/1977, edited by H.R. Huff et al., Academic Press (1977), pp. 626-636.
K. Graff et al., "The Carrier Lifetime of Heat-Treated Silicon Crystals," *J. Electronic Mat'ls*, vol. 4, pp. 281-298 (1975).
K. Morizane et al., "Impurity Distribution In Single Crystals," *J. Electrochem. Soc.*, vol. 114, pp. 738-742 (1967).
A. R. Bean et al., "The Effect of Carbon on the Thermal Donor Formation In Heat Treated Pulled Silicon Crystals," *J. Phys. Chem. Solids*, vol. 33, pp. 255-268 (1972).
J. G. Fossum et al., "Physical Operation of Back-Surface-Field Silicon Solar Cells," *IEEE Trans. Electron Devices*, vol. ED-24, pp. 322-325 (1977).
T. B. S. Chadda et al., "Comparison of Vertical Multijunction & Conventional Solar Cell Performance," *Conf. Record, 10th IEEE Photovoltaic Specialists Conf.* (1973), pp. 52-57.
M. D. Godlewski et al. "Low-High Junction Theory Applied to Solar Cells," Conf. Record, 10th IEEE Photovoltaic Specialists Conf. (1973), pp. 40-49.

*Primary Examiner*—Aaron Weisstuch
*Attorney, Agent, or Firm*—Arthur A. Smith, Jr.; Peter Manus

[57] ABSTRACT

A solar cell with improved energy conversion characteristics is formed from ordinary Czochralski or other types of silicon crystals that are sliced parallel to the growth axis or pulling direction. The slices are heat treated at a sufficiently high temperature and for a sufficiently long period of time to activate oxygen donor states in the slices. The heat treatment is of sufficient duration that at periodic maxima of oxygen concentration in the crystal it produces n-type regions where a background p-type dopant is overcompensated. Each n-type region thus formed is adjacent to a p-type region with a p-n junction therebetween. Collector contacts are applied at the faces of the slices to permit collection of carriers.

18 Claims, 7 Drawing Figures

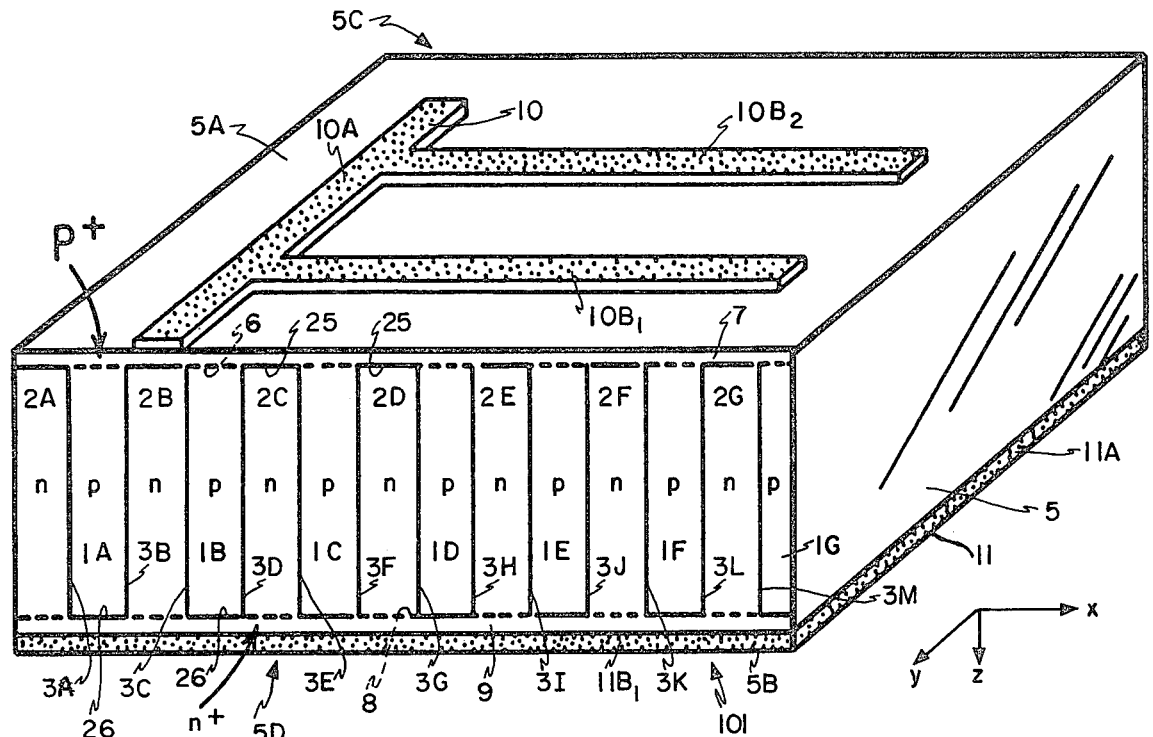
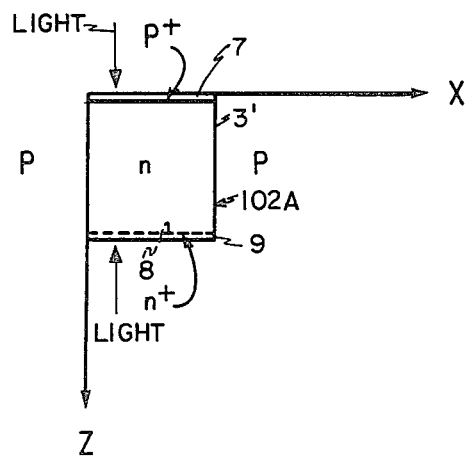
FIG. 4A
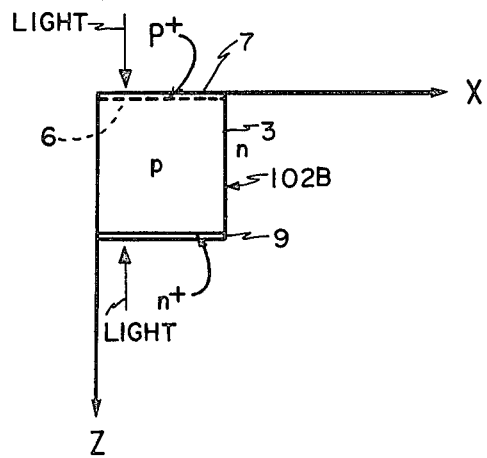
FIG. 4B

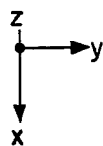
FIG. 3A
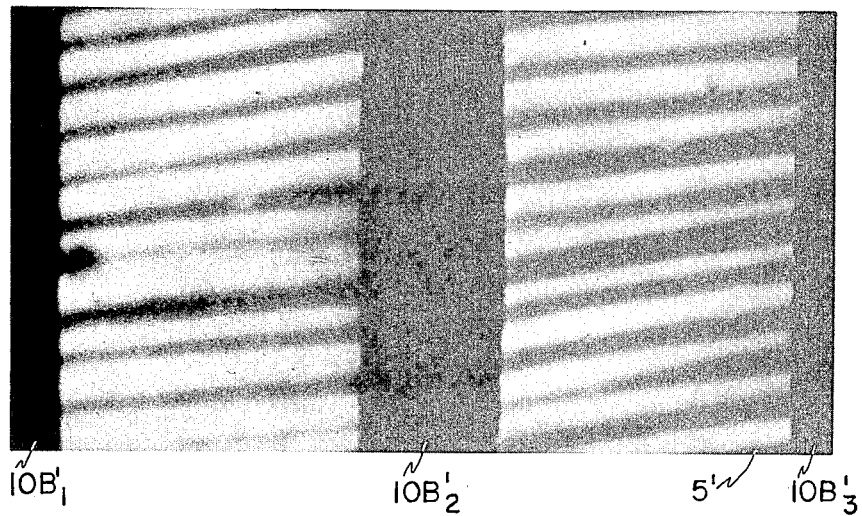
$10B'_1$    $10B'_2$    $5'$    $10B'_3$
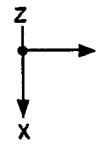
FIG. 3B
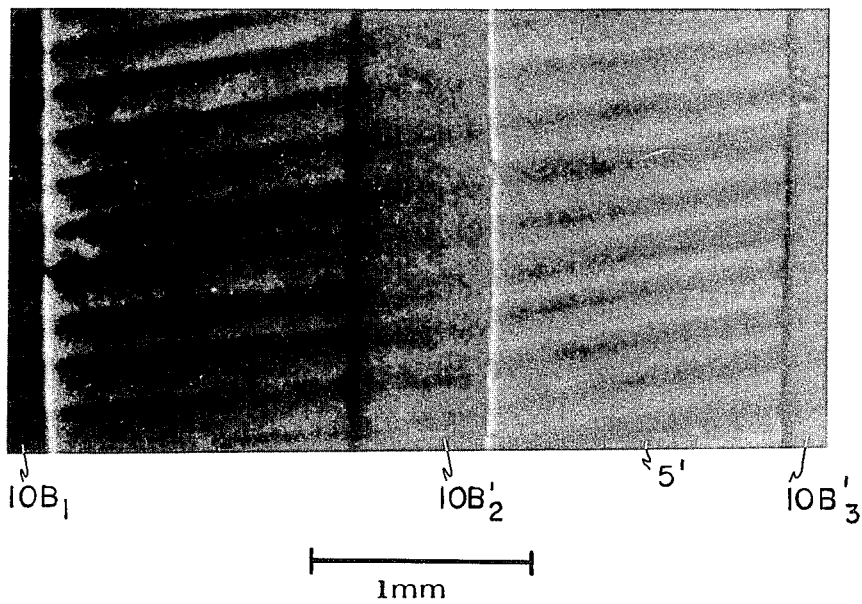
$10B_1$    $10B'_2$    $5'$    $10B'_3$
1mm

SOLAR CELL HAVING MULTIPLE P-N JUNCTIONS AND PROCESS FOR PRODUCING SAME

The Government has rights in this invention pursuant to Grant Number NSG-3017 awarded by the National Aeronautics and Space Administration.

BACKGROUND OF THE INVENTION

The present invention relates generally to solid state solar energy conversion cells. More specifically it relates to a process for fabricating multiple p-n junction devices from Czochralski silicon crystals.

Various solid state devices are known which are capable of converting light energy incident on the device into electrical energy. Two major problems with these devices have been the low efficiency of this conversion over the spectrum of sunlight and relatively high production costs.

Several devices of this type include a back surface field (BSF) cell and a vertical multi-junction (VMJ) cell. The BSF cell is discussed generally in J. G. Fossum, "Physical Operation of Back-Surface-Field Silicon Solar Cells ", IEEE Trans. on Electron Devices, Vol. ED-24, pp. 322–325 (1977). The VMJ cell is described in T. B. S. Chadda and M. Wolf, "Comparison of Vertical Multi-Junction and Conventional Solar Cell Performance", Proceedings of the 10th IEEE Photovoltaic Specialists Conference, pp. 52–57 (1974). The VMJ cells have improved efficiency and radiation hardness as compared to more conventional BSF cells, however, they are more difficult to fabricate. Also, these cells can be illuminated on only one surface.

It is therefore a principal object of the present invention to provide a process for fabricating multiple p-n junction devices and a device of this type which is an efficient solar energy conversion cell.

Another object is to provide a process whereby multiple p-n junctions are formed in a single silicon crystal.

Still another object is to provide a solar cell which is less costly to fabricate than known cells with comparable energy conversion efficiencies.

Yet another object is to provide a solar cell that is responsive to the full spectrum of sunlight, particularly long wavelength light, and can be illuminated at both major surfaces.

SUMMARY OF THE INVENTION

A process for fabricating multiple p-n junction semiconductor devices uses a Czochralski silicon crystal grown from the melt along a pulling direciton. The silicon crystal is sliced along the pulling direction. The crystal and the slices are p-type doped and contained striated or periodically varying concentrations of electrically inert oxygen. The slices are then heat treated at a temperature that is high enough and for a time period that is sufficiently long to activate oxygen donor states. In particular, at the maxima of the oxygen concentration the thermal donor states overcompensate the background p-type dopant to produce n-type regions, each n-type region being adjacent to a p-type region with a p-n junction therebetween. When electrical contacts are selectively applied to the p-type and n-type regions to permit collection of charge carriers in the slice thus treated, there results a solar cell of improved energy conversion efficiency that is economical to produce and accepts light at either major face of the slice.

In general, the spacing between regions depends on the pull rate and the rotation rate. The heating temperature and duration vary with the dopant, oxygen and carbon concentrations of the silicon crystal. Recommended values are 450° C. for 50 hours. Heating should be conducted in an inert atmosphere such as argon. The temperature should not be sufficiently high or maintained for a sufficiently long period of time to result in any substantial diffusion of the oxygen in the silicon crystal lattice.

These and other features and objects of the invention will be described in detail below with reference to the accompanying drawings.

BRIEF DESCRIPTION OF THE DRAWINGS

FIG. 2 is an isometric schematic representation of a photovoltaic multiple-cell device according to the present invention;

FIGS. 3A and 3B are electron beam induced current (EBIC) photomicrograph images showing a plan view of a photovoltaic cell similar to the structure of FIG. 2 with FIG. 3B being a differentiated EBIC image;

FIGS. 4A and 4B are each a schematic representation of a single cell of the type shown in FIG. 2.

DETAILED DESCRIPTION OF THE PREFERRED EMBODIMENTS

Figure 1:
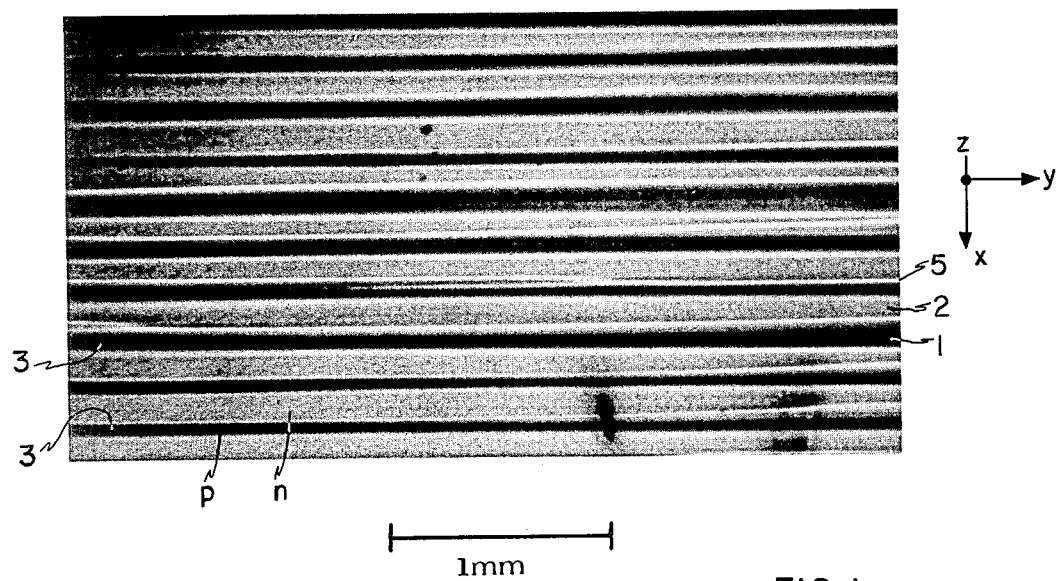
FIG. 1 is a photomicrograph plan view of a longitudinal Czochralski-grown silicon crystal etched to show multiple p-n junctions according to this invention.

The present invention involves the fabrication in a monolithic device of many photovoltaic cells such as the cells 102A and 102B shown in FIGS. 4A and 4B, respectively. The cells are formed from an ordinary Czochralski-grown silicon crystal by processing that crystal according to the present invention. The cells 102A, 102B and so forth are spaced from one another along the longitudinal axis (i.e., the growth axis or the pulling direction for the melt from which the crystal is formed) of the crystal, which is the x-direction in this specification. Each cell consists of either a p-region or an n-region positioned, respectively, between n-regions or p-regions. A p-n junction arises at each interface between a p and n region. Collector contacts are provided selectively to the p-regions and the n-regions. The contacts collect charge generated by the cell when exposed to light. The cells thus operate as solar cells.

In the embodiments shown herein a p+ diffusion region 7 in FIG. 4B is provided for electrical connection to the cell 102B (the electrical connector contacts are applied to the diffusion region 7, as noted below). An n+ diffusion region 9 is provided for electrical connection to the cell 102A in FIG. 4A. The broken lines 6 indicates electric connection (ohmic in nature) between the p+ diffusion region 7 and the p-region 1. The broken line 8 indicates electric connection (ohmic in nature), between the n+ diffusion region 9 and the n-region 2. Light is accepted at the top, bottom or both the top and bottom (e.g., by suitable reflectors) of the cells 102A and 102B for charge carrier generation. While only a few cells are shown in the figures, an important aspect of this invention is that it permits fabrication of photovoltaic devices having many (e.g., fifty, one hundred or more) cells like the cells 102A and 102B in a single crystal.

Turning now to FIG. 2, a photovoltaic device 101 of the present invention comprises a plurality of p-regions 1A, 1B ... and a plurality of n-regions 2A, 2B .... The p-regions and the n-regions are distributed along the x-direction so that a p-region is disposed between two n-regions and vice versa. A p-n junction separates a p-region from the adjacent n-regions and vice versa. The p-n junctions are marked 3A, 3B ... and are formed in the manner discussed in detail later.

The device 101 consists of a single crystal 5 in which the p-regions 1A ... and the n-regions 2A ... are formed. The crystal 5 (which is greatly enlarged in FIG. 2) is a wafer having a flat upper major surface 5A and a flat lower major surface 5B, as well as flat transverse minor surfaces 5C and 5D.

The p+ diffusion region 7 is located at the upper major surface 5A of the device 101 and is in electrical contact with the p-regions 1A, 1B ... as indicated by the broken lines 6. The n+ diffusion region 9 at the lower major surface 5B of the device 101 is in electrical contact with the n-regions 2A, 2B ... as indicated by the broken lines 8. A first electrode 10 is in electrical contact with the p+ diffusion region and a second electrode 11 is in electrical contact with the n+ diffusion region 9. The electrode 10 may be an aluminum deposition but it is in such form that light can strike the upper major surface 5A of the device 101 for solar cell collection purposes. The electrode 11 may be a duplicate of the electrode 10 or solid, depending on whether or not the lower surface of the device 101 is intended to receive light. (The electrode 10 typically will consist of a bus 10A and one or more fingers $10B_1$, $10B_2$ ... ; the electrode 11 consists of a bus 11A and one or more fingers $11B_1$ ..., but may be solid.) Also, the p+ diffusion region 7 and associated collector contact or electrode 10 can be applied at the minor surface 5C, rather than at the major surface 5A. Likewise the n+ diffusion region 9 and associated collector contact or electrode 11 can be applied at the minor surface 5D, rather than the major surface 5B. These latter two collector connection arrangements have the advantage of increasing the conversion efficiency of the device 101.

The process by which the device 101 is fabricated and the underlying theories are now taken up. The present invention starts with an as-grown (i.e., ordinary or conventional Czochralski) silicon crystal. The crystal is doped with a p-type material such as boron. The crystal is cut to form longitudinal (i.e., parallel to the growth or pulling axis) slices of the silicon material. The crystal and the slices contain striations of oxygen whose concentration varies periodically between adjacent maxima and minima. The slices are heat treated at a temperature which is high enough and for a sufficient period of time to activate oxygen donor states (as explained further below) in the slices. This heat treatment is carried out at temperatures and durations so that at the maxima of the oxygen concentration the electrons available from the oxygen donor states overcompensate the background p-type dopant in the silicon crystal. Recommended values for the heat treatment are approximately 450° C. for approximately 50 hours. Because the initial oxygen concentration varies periodically across the slice, this creation of n-regions coincident with oxygen maxima leads to alternating p and n regions in the slice. As a result, a plurality of p-n junctions are created which are separated from one another along the longitudinal direction (i.e., the x-direction in FIG. 2) by a p-region or an n-region. In FIG. 1 the junctions are labeled 3 in a crystal 5 which has been heat treated in accordance with the present teaching. In FIG. 1 the dark regions are p-type regions 1 and the light regions are n-type regions 2.

Turning to the process of the present invention in more detail, Czochralski grown silicon crystals contain a significant concentration of oxygen (1 to $20 \times 10^{17}$ cm$^{-3}$) which has been shown to be nonuniformly distributed. The oxygen, as well as other dopant impurities, is distributed within the crystal lattice in a striated pattern of minima and maxima that are oriented perpendicular to the growth direction. In as-grown silicon, this dissolved oxygen is essentially electrically inert. Upon heat treatment at a temperature of at least 450° C., however, oxygen forms a donor state. It has been shown that the concentration of thermal donors is proportional to the cube of the oxygen concentration. At 450° C. the oxygen distribution remains virtually unchanged (the diffusion length of oxygen is on the order of 20 A for 80 hours at 450° C., as computed from high temperature diffusion data). Furthermore, heat treatment at this temperature enhances significantly the lifetime of the minority carriers. Thus, by determining the thermal donor distribution, one can obtain the microdistribution of oxygen as incorporated in the crystal during growth.

In p-type (of the order of $10^{15}$ cm$^{-3}$) Czochralski grown silicon, the oxygen concentration fluctuates, and hence that of the oxygen thermal donors. This leads to compensation of the p-type matrix and to overcompensation (inversion of the conductivity type) at the oxygen concentration maxima under heat treatment according to this invention. An example of p-n junction formation, as above noted, is shown in FIG. 1, which is a microphotograph of an etched longitudinal slice of Czochralski grown silicon doped with boron to a level of about $10^{15}$ cm$^{-3}$. The growth or pulling direction is parallel to the surface of the slice (i.e., the x-direction) and perpendicular to the p-n junctions 3. The sample was heat-treated at 450° C. for 80 hours in an inert ambient (Ar) and then etched in 20:3:1 $CH_3COOH$: $HNO_3$:HF to delineate the p-n junctions. In the present case, the average spacing between junctions is about 100 μm. This spacing depends on the dopant concentration, oxygen concentration and carbon concentration of the starting material. The heat-treating time can be carried over a wide rage (from a few minutes to more than 100 hours) to optimize the materials parameters for various device applications.

In order to utilize the multiple junctions for device application, the thin p+ and n+ layers were diffused to the top and bottom of the p-type longitudinal slices before activating the vertical junctions by the 450° C. heat treatment. Contacts to the top and bottom of the silicon slice are then made in the conventional manner, after the heat treatment, as shown schematically in FIG. 2. The vertical or transverse p-n junctions 3A, 3B ... in FIG. 2, together with their horizontal shallow components (resulting from the diffused n+ and p+ layers) are represented by a continuous solid line (the solid lines respectively labeled 25 at the upper surface and 26 at the lower surface of the crystal 5 in FIG. 2 are the horizontal shallow components). High-low horizontal junctions between the alternating p-n junctions parallel to the two major surfaces are represented by the dashed lines 6 and 8, as above noted.

EBIC images of the resulting structure are shown in FIGS. 3A and 3B. The parallel bright and dark narrow bands represent the n and p segments, respectively, in the base region of the cell structure forming a plurality of junctions perpendicular to the surface. The shallow alternating p-n and high-low junctions parallel to the bottom and the top surfaces of the cell (FIG. 2) are not seen in the EBIC images of FIGS. 3A and 3B. FIGS. 3A and 3B show a crystal 5' like the crystal 5, for example, with conductive fingers $10B_1$, $10B_2$ and $10B_3$.

As will be apparent to those skilled in the art, a part of the structure as shown in FIG. 2 resembles the back surface field (BSF) cell but bound by vertical junctions on two sides (FIG. 4A). The other part resembles the vertical junction cell but with a high-low junction on top and a collection p-n junction at the bottom (FIGS. 4A and 4B).

In order to compare the potential of the present structure with the conventional structure (BSF photovoltaic cell with a single shallow p-n junction), theoretical calculations were carried out on its photovoltaic collection efficiency. For simplicity, the following assumptions were made in carrying out these calculations. (1) The excess carriers are generated in the base region; the contribution to carrier collection from the diffused regions are highly doped and shallow, and the absorption coefficient of silicon is relatively small. (2) The effect of high-low junctions on the carrier collection can be approximated by a low surface recombination. (3) Within the space charge region associated with the p-n junctions, the electric field is strong enough to sweep the mobile minority carriers across the space charge region. The contribution of the carriers generated in the space charge region is neglected. (4) The material properties within the p and n regions are uniform; i.e., no electric field is present outside the space charge regions of the p-n junctions. (5) The incident light is normal to and uniform across the cell surface. A low junction level is assumed.

With the above assumptions, the minority carrier transport equation for the structures of FIG. 4A can be written as:

$$\nabla^2 \Delta p - \frac{\Delta p}{l^2} = \frac{-1}{D_p} g(\lambda) e^{-\alpha(\lambda) z} \quad (1)$$

where $\Delta p$ is the concentration of the excess carriers, l is the minority carrier diffusion length, $D_p$ is the carrier diffusion coefficient, $\alpha(\lambda)$ = the absorption coefficient, z is the light penetration depth, and $g(\lambda) = [1 - R(\lambda)] \eta (\lambda) N (\eta) \alpha(\lambda)$, where $R(\lambda)$ is the reflection coefficient, $\eta(\lambda)$ is the quantum yield (it is assumed to be one over the spectral range considered); $N(\lambda)$ is the number of incident photons per cm² per second per unit bank width.

The boundary conditions for eq. 1 are: at the edge of the space charge region p=0, at the edge of high-low junctions $D_p \nabla \alpha p.n_j = S \Delta p$ where $n_j$ is the unit vector normal to high-low junctions and S is the surface recombination velocity of the high-low junction.

The solution of eq. (1) was achieved by assuming a general solution of the form:

$$\Delta p = \Sigma m\, f_m (z) \sin m\pi/w \quad (2)$$

where z and x are the directions as indicated in FIG. 4A, m is an integer, and w is the width of the individual cell considered. The coefficients of the series $f_m (z)$ can be readily obtained in analytic form. The theoretical collection efficiency was obtained by calculating the average diffusion current over the two substructures of the cell (FIGS. 4A and 4B) with specific material parameters.

Figure 5:
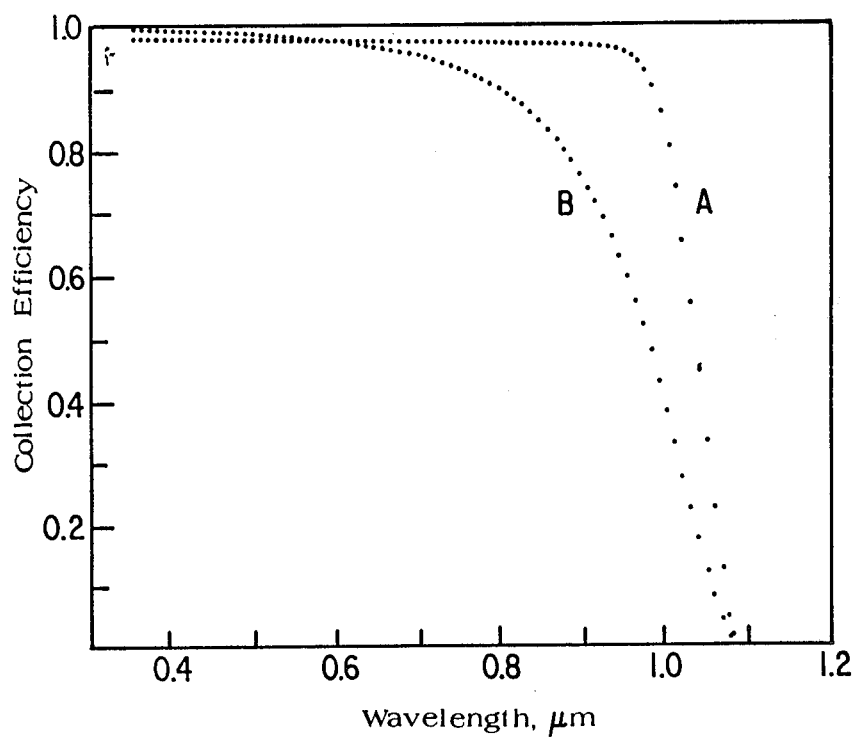
FIG. 5 is a graph of calculated collection for a solar cell of the present invention (curve A) and a conventional BSF cell (curve B).

A typical calculation for a device according to the present invention is plotted as curve A in FIG. 5. The device has the following materials parameters: minority carrier diffusion length 100 μm, width of the p and n regions 50 μm, thickness of the structure 300 μm. Surface recombination velocity of high-low junction is zero, reflection from the surface is neglected and absorption coefficient is taken the 1978 Annual Book of ASTM Standards, part 43, F391. Calculations were also carried out on the collection efficiency of the conventional BSF structure under the above assumptions (1–5) and the same parameters used in calculations on the structure presented here; these calculations were based on expressions and solutions reported in the literature and are plotted in FIG. 5 as curve B. The total collection efficiency of the multiple p-n junction structure according to the present invention is 91.98% as compared to 82.76% for the prior art BSF cell under above stated conditions. At long wavelengths, the present cell shows a significantly enhanced collection efficiency.

The general shape of the spectral response curve B resembles that of VMJ cells, as expected. In addition to improved efficiency, the present cell should exhibit the radiation hardness normally associated iwth the VMJ cell while being considerably simpler to fabricate. Furthermore, the present cell structure may be illuminated on both sides.

In summary, this invention provides a solar cell structure which displays advantages of both the BSF and VMJ solar cell structures. The present structure can be conveniently obtained from Czochralski-grown crystals, and was calculated above to have better collection efficiency than the conventional BSF structure.

Modifications of the invention herein disclosed will occur to persons skilled in the art and all such modifications are deemed to be within the scope of the invention as defined by the appended claims.

What is claimed is:

1. A process for fabricating multiple p-n junctions from a silicon crystal pulled from the melt, that comprises: forming a slice of the silicon crystal along the pulling direction; heat treating the slice at a temperature that is high enough to activate oxygen donor states in the slice and for a time period sufficient for activation to occur and at the maxima of the oxygen concentration to overcompensate the background p-type dopant present in the ordinary silicon crystal and lead to n-type regions, each n-type region being adjacent to a p-type region with a p-n junction therebetween; and applying electrical contacts selectively to the p-type regions and the n-type regions to permit collection of charge carriers therein.

2. A process as defined by claim 1 wherein said temperature is about 450° C.

3. A process as defined by claim 2 wherein said time period is about fifty hours.

4. A process as claimed in claim 1 wherein said electrical contacts are applied to a p+ region and an n+ region applied respectively at parallel faces of the longitudinal slice and which includes the further steps of diffusing a p+ type material at one of the parallel faces and an n+ type material at the other of said faces.

5. A process as claimed in claim 1 that includes the further steps of diffusing a p+ material at one face of the slice of the silicon crystal to form a p+ region, diffusing an n+ material at another face of the slice of the silicon material to form an n+ region and applying contacts respectively to the p+ region and the n+ region, the combination of the p+ region and its associated contact and the n+ region and its associated contact constituting said electrical contacts.

6. A process as claimed in claim 5 wherein the p+ region and the n+ region are applied respectively at parallel faces of the slice of the silicon crystal.

7. A process as claimed in claim 6 wherein the parallel faces are the major surfaces of the slice of the silicon crystal.

8. A process as claimed in claim 6 wherein the parallel faces are minor faces of the crystal.

9. A process as claimed in claim 1 wherein said silicon crystal is an ordinary Czochralski crystal grown for device applications and in which said slice is a longitudinal slice.

10. A semiconductor device that comprises: a plurality of p-regions and a plurality of n-regions in a structure in which the p-regions and n-regions are located along one direction such that a p-region is positioned between two n-regions and vice versa, with a p-n junction between each p-region and the adjacent n-regions and vice versa; a p+ diffusion region at one surface of the device in electrical contact with the p-regions at one transverse end of each p-region; an n+ diffusion region at another surface of the device in electrical contact with the n-regions at one transverse end of each n-region; first electrode means in electrical contact with the p+ diffusion region; and second electrode means in electrical contact with the n+ diffusion region, said p-regions and said n-regions occurring in a single as grown silicon crystal that is grown along said one direction and is doped with a p-type material to produce said p-regions and where said n-regions are striations of maxima of oxygen concentration occurring in said p-doped silicon crystal that are heat treated to activate oxygen donor states.

11. A device as claimed in claim 10 wherein said device comprises a slice of said as grown silicon crystal cut parallel to said one direction, and in which the p+ diffusion region is at one major surface of the device and the n+ diffusion region is at the other major surface of the device and in which light will be received at at least one surface, which light serves to create charge carriers at the p-n junctions.

12. A device as claimed in claim 10 in which at least one of the first electrode means and the second electrode means comprises a bus and at least one finger in electrical contact with the associated diffusion region to permit light to strike the surface at which the particular electrode is located.

13. A device as claimed in claim 12 in which both the first electrode means and the second electrode means comprise a bus and at least one finger in electrical contact with the associated diffusion region.

14. A device as claimed in claim 10 wherein said structure is in the form of a slab having two major surfaces or faces and four minor surfaces or faces, wherein the p+ diffusion region and the first electrode means are disposed at one of the four minor surfaces or faces, and wherein the n+ diffusion region and the second electrode means are disposed at another of the four minor surfaces or faces to permit the whole of the major surfaces to be available to accept light.

15. A device as claimed in claim 10 wherein the electrode means are metal strips deposited on the associated surface and in electrical contact with the associated diffusion region.

16. A semiconductor device that comprises at least several p-regions and at least several n-regions in a structure in which the p-regions and the n-regions are in a spaced juxtaposed relationship to one another along one direction such that each p-region is positioned between two n-regions and vice versa with a p-n junction between each p-region and the adjacent n-region, which p-regions and n-regions receive light which create charge carriers within the device, and means to effect electrical connection to the p-regions and the n-regions, said p-regions and said n-regions occurring in a single as grown silicon crystal that is grown along said one direction and is doped with a p-type material to produce said p-regions and where said n-regions are striations of maxima of oxygen concentration occurring in said p-doped silicon crystal that are heat treated to activate oxygen donor states.

17. A device as claimed in claim 16 in which the means to effect electrical connection comprises a p+ region in contact with said p-regions and an n+ region in contact with said n-regions.

18. A device as claimed in claim 17 that further includes electrical connectors respectively in contact with the p+ region and the n+ region.

* * * * *